(12) United States Patent
Fujii

(10) Patent No.: US 10,217,791 B2
(45) Date of Patent: Feb. 26, 2019

(54) METHOD OF MANUFACTURING BONDED SUBSTRATE, BONDED SUBSTRATE, METHOD OF MANUFACTURING SOLID-STATE IMAGING APPARATUS, SOLID-STATE IMAGING APPARATUS, AND CAMERA

(71) Applicant: Sony Corporation, Tokyo (JP)

(72) Inventor: Nobutoshi Fujii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/368,284

(22) Filed: Dec. 2, 2016

(65) Prior Publication Data

US 2017/0084647 A1 Mar. 23, 2017

Related U.S. Application Data

(63) Continuation of application No. 14/147,003, filed on Jan. 3, 2014, now Pat. No. 9,530,687, which is a
(Continued)

(30) Foreign Application Priority Data

Nov. 30, 2009 (JP) .................................. 2009-272491

(51) Int. Cl.
*H01L 27/146* (2006.01)
*H01L 21/762* (2006.01)
(Continued)

(52) U.S. Cl.
CPC .... *H01L 27/1469* (2013.01); *H01L 21/76251* (2013.01); *H01L 27/1462* (2013.01);
(Continued)

(58) Field of Classification Search
CPC .................... H01L 21/14632; H01L 27/14683
(Continued)

(56) References Cited

U.S. PATENT DOCUMENTS

| 2006/0110099 A1* | 5/2006 | Ogawa | ...................... G02B 6/42 |
| | | | 385/14 |
| 2007/0022590 A1* | 2/2007 | Hirano | ................... H01G 9/012 |
| | | | 29/25.03 |

(Continued)

FOREIGN PATENT DOCUMENTS

JP 2009-117533 5/2009
KR 10-2009-0117982 11/2009
(Continued)

OTHER PUBLICATIONS

Official Action (with English translation) for Korean Patent Application No. 10-2017-0008644 dated Mar. 15, 2017, 13 pages.
(Continued)

*Primary Examiner* — Bo Fan
(74) *Attorney, Agent, or Firm* — Sheridan Ross P.C.

(57) ABSTRACT

Disclosed herein is a method of manufacturing a bonded substrate, including the steps of: forming a first bonding layer on a surface on one side of a semiconductor substrate; forming a second bonding layer on a surface on one side of a support substrate; adhering the first bonding layer and the second bonding layer to each other; a heat treatment for bonding the first bonding layer and the second bonding layer to each other; and thinning the semiconductor substrate from a surface on the other side of the semiconductor substrate to form a semiconductor layer.

17 Claims, 10 Drawing Sheets

Related U.S. Application Data continuation of application No. 12/944,193, filed on Nov. 11, 2010, now Pat. No. 8,642,444.

(51) Int. Cl.
*H01L 31/18* (2006.01)
*H04N 5/374* (2011.01)

(52) U.S. Cl.
CPC .. *H01L 27/14621* (2013.01); *H01L 27/14627* (2013.01); *H01L 27/14632* (2013.01); *H01L 27/14634* (2013.01); *H01L 27/14636* (2013.01); *H01L 27/14645* (2013.01); *H01L 27/14683* (2013.01); *H01L 31/18* (2013.01); *H04N 5/374* (2013.01); *Y10T 428/24421* (2015.01)

(58) Field of Classification Search
USPC ......... 438/455, 458; 257/713, 767, 621, 432
See application file for complete search history.

(56) References Cited

U.S. PATENT DOCUMENTS

| | | | |
|---|---|---|---|
| 2008/0029896 A1* | 2/2008 | Lee | H01L 21/76843 257/767 |
| 2008/0277778 A1* | 11/2008 | Furman | H01L 21/2007 257/713 |
| 2008/0293217 A1* | 11/2008 | Ghyselen | H01L 21/3148 438/458 |
| 2009/0061649 A1* | 3/2009 | Gates | C23C 16/401 438/781 |
| 2009/0108413 A1* | 4/2009 | Ohmi | H01L 21/0212 257/632 |
| 2009/0130414 A1* | 5/2009 | Kim | C23C 16/40 428/220 |
| 2009/0181518 A1* | 7/2009 | Omata | H01L 21/187 438/455 |
| 2009/0242951 A1* | 10/2009 | Ueno | H01L 27/1462 257/292 |

FOREIGN PATENT DOCUMENTS

| | | |
|---|---|---|
| KR | 2009-0117982 | 11/2009 |
| WO | WO 2008/025475 | 3/2008 |

OTHER PUBLICATIONS

Official Action (with English translation) for Korean Patent Application No. 10-2017-0008664 dated Dec. 13, 2017, 7 pages.

Official Action (with English translation) for Korean Patent Application No. 10-2017-0008644 dated Sep. 27, 2017, 6 pages.

\* cited by examiner

F I G . 1
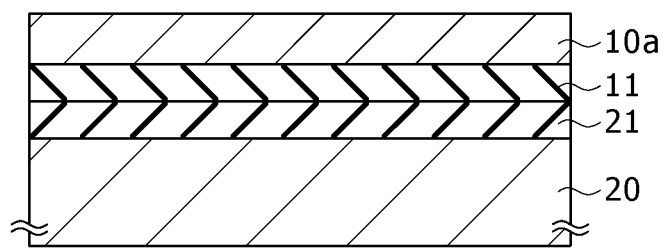

METHOD OF MANUFACTURING BONDED SUBSTRATE, BONDED SUBSTRATE, METHOD OF MANUFACTURING SOLID-STATE IMAGING APPARATUS, SOLID-STATE IMAGING APPARATUS, AND CAMERA

CROSS-REFERENCE TO RELATED APPLICATIONS

This application is a continuation of U.S. patent application Ser. No. 14/147,003, filed Jan. 3, 2014 which is a continuation of U.S. patent application Ser. No. 12/944,193, filed Nov. 11, 2010, now U.S. Pat. No. 8,642,444, which claims priority to Japanese Patent Application Ser. No. JP 2009-272491, filed in the Japan Patent Office on Nov. 30, 2009, the entire disclosures of which are hereby incorporated herein by reference.

BACKGROUND OF THE INVENTION

1. Field of the Invention

The present invention relates to a method of manufacturing a bonded substrate, a bonded substrate manufactured thereby, a method of manufacturing a solid-state imaging apparatus, a solid-state imaging apparatus manufactured thereby, and a camera. More particularly, the invention relates to a method of manufacturing a solid-state imaging apparatus in which pixels having photodiodes are arranged in a matrix pattern on a light-receiving surface, a solid-state imaging apparatus manufactured thereby, a method of manufacturing a bonded substrate for the same, a bonded substrate manufactured thereby, and a camera including the solid-state imaging apparatus.

2. Description of the Related Art

A method for directly bonding semiconductor substrates to each other, generally, uses bonding by dehydration condensation between silicon oxide films, as represented by a method of manufacturing a SOI (Silicon On Insulator) type substrate.

In the method of manufacturing the SOI substrate, for example, after tentative bonding of silicon oxide films to each other, a heat treatment at a high temperature is conducted to effect dehydration condensation, thereby enhancing the bonding strength. In order to obtain a sufficient bonding strength, a sufficient dehydration condensation reaction may be needed and, in general, a high temperature of 800 to 1200° C. may be necessary.

While a heat treatment at a lower temperature has also been reported in this connection, temperatures in excess of 500° C. have been reported, as described in, for example, Japanese Patent Laid-open No. 2001-274368 (hereinafter referred to as Patent Document 1).

For conducting bonding at a further lower temperature, there has been carried out a method of utilizing acceleration of modification of a silicon oxide film surface by irradiation with plasma or by treatment with a liquid chemical.

In addition, a technique frequently used as a method for bonding at a low temperature is bonding by an adhesive, as described in, for example, Japanese Patent Laid-open No. 2008-300551 (hereinafter referred to as Patent Document 2).

In the case where semiconductor substrates which carry semiconductor devices with metallic wiring and the like are directly bonded to each other for manufacturing a semiconductor apparatus, the upper limit of a treating temperature in a heat treatment applied to the substrates is limited by the melting point of the metal used for the wiring and by the characteristics of the semiconductor apparatus desired.

Particularly, in the case where copper is used for wiring, the upper limit of the heat treatment temperature should be not more than 400° C.

In this case, as a method of bonding semiconductor substrates to each other at a low temperature of 400° C. or below, the above-mentioned bonding through surface modification by irradiation with plasma or by treatment with a liquid chemical or the above-mentioned bonding by an adhesive is normally carried out.

The method based on the use of an adhesive has problems in that the upper limit of temperature is determined by the heat-resistant temperature of the adhesive itself or that durability to liquid chemicals used in forming the semiconductor devices is low.

On the other hand, in the case of bonding through surface modification by irradiation with plasma or by treatment with a liquid chemical, a treatment at a low temperature of 400° C. or below is insufficient in temperature for the dehydration condensation intended, so that the bonding strength obtained thereby is lower than the bonding strength obtained by a heat treatment at a high temperature of not less than 800° C.

The high bonding strength obtained by the high-temperature heat treatment is considered to be attributable partly to a phenomenon in which hydroxyl groups are vibrated by thermal vibration, whereby intervals between the hydroxyl groups are shortened, resulting in that even those hydroxyl groups which are spaced too far from each other at a low temperature to react with each other can be brought into dehydration condensation.

In the case of a low bonding strength, there is a fear that exfoliation from the faying surface (bonding surface or joint surface) might occur during a processing of the wafer after bonding. Even in the cases of low-temperature bonding, therefore, there is a need for a technology by which a bonding strength as high as possible can be obtained.

In order to raise the bonding strength obtained by a low-temperature heat treatment, it is important to increase the density of Si—O—Si bonds produced by the dehydration condensation reaction.

Examples of the means for increasing the Si—O—Si bond density include:

(1) to apply such an energy that vibration comparable to the thermal vibration of hydroxyl groups generated at high temperature can be obtained, to the interface after tentative bonding; and (2) to form such a faying surface that a hydroxyl group interval permitting a dehydration condensation reaction even in the case of small amplitude of vibration can be obtained, specifically, to raise the density of hydroxyl groups in the surface.

As the approach of (1) above, there may be contemplated a method of irradiating with optical energy, such as laser, that acts on the faying surface. In the case where semiconductor devices are present, however, a reaction should be induced only at the faying surface.

In order to meet the requirement, it may be necessary to provide a special light-absorbing layer at the faying surface and to use a substrate transparent to the wavelength of the light as at least one of the substrates to be bonded. Such measures are highly difficult to realize in an ordinary fabrication process for semiconductor devices.

The method of (2) above, on the other hand, can be embodied by regulations as to the surface modification process or as to the film properties at the faying surface, and is therefore easier to realize.

As the method based on regulations of the film properties at the faying surface, a large number of methods have been attempted. For instance, Japanese Patent Laid-open No. 2009-173949 (hereinafter referred to as Patent Document 3) discloses a method in which a functional group is introduced into an oxide film and eliminated (leaving) portions of the functional groups are utilized for bonding.

Though formation of hydroxyl groups is easily achieved by this method, however, the density of the hydroxyl groups formed at the eliminated (leaving) portions of the functional groups is the same as the density of the hydroxyl groups formed at the surface of the oxide film, so that the hydroxyl groups do not contribute to enhancement of the bonding strength obtained by a low-temperature heat treatment.

In addition, most of functional groups are hydrophobic in nature. Therefore, there arises a problem that the uneliminated (unleaving) functional groups in the oxide film repel the water molecules produced by dehydration condensation, resulting in easy formation of voids at the faying surface.

Japanese Patent Laid-open No. 2005-285988 (hereinafter referred to as Patent Document 4) contains a description of a back-illuminated type solid-state imaging apparatus.

A. Kuwabara et al., Phys. Rev., B78, (2008) 064104 (hereinafter referred to as Non-Patent Document 1) describes a mean inter-atomic distance in such material as silicon oxide, silicon nitride and silicon carbide.

R. H. Dauskardt et al., Engineering Fracture Mechanics 61, (1998) pp. 141 to 162 (hereinafter referred to as Non-Patent Document 2) describes a bonding strength measuring method based on the four-point bending technique.

SUMMARY OF THE INVENTION

As above-mentioned, in the method for manufacturing a bonded substrate by bonding semiconductor substrates to each other, it has been difficult to obtain a high bonding strength by a bonding (joining) treatment carried out at a low temperature.

According to an embodiment of the present invention, there is provided a method of manufacturing a bonded substrate, including the steps of: forming a first bonding layer on a surface on one side of a semiconductor substrate; forming a second bonding layer on a surface on one side of a support substrate; adhering the first bonding layer and the second bonding layer to each other; a heat treatment for bonding the first bonding layer and the second bonding layer to each other; and thinning the semiconductor substrate from a surface on the other side of the semiconductor substrate to form a semiconductor layer. In the manufacturing method, a layer having silicon carbide or silicon carbonitride is formed at a surface of at least either one of the first bonding layer and the second bonding layer, in at least either one of the first bonding layer forming step and the second bonding layer forming step.

In the bonded substrate manufacturing method as above, the first bonding layer is formed on a surface on one side of the semiconductor substrate and, on the other hand, the second bonding layer is formed on a surface on one side of the support substrate. Next, the first bonding layer and the second bonding layer are adhered to each other, followed by a heat treatment to thereby bond (join) the first bonding layer and the second bonding layer to each other. Subsequently, the semiconductor substrate is thinned from the surface on the other side of the semiconductor substrate, thereby forming a semiconductor layer.

Here, a layer having silicon carbide or silicon carbonitride is formed at a surface of at least either one of the first bonding layer and the second bonding layer, in at least either one of the first bonding layer forming step and the second bonding layer forming step.

According to another embodiment of the present invention, there is provided a bonded substrate including: a semiconductor layer having an electronic circuit; a support substrate supporting the semiconductor layer; a first bonding layer formed on a surface, on the support substrate side, of the semiconductor layer; and a second bonding layer which is formed on a surface, on the semiconductor layer side, of the support substrate and which is bonded to the first bonding layer; wherein either one of the first bonding layer and the second bonding layer has silicon carbide or silicon carbonitride.

In the bonded substrate as above, the semiconductor layer having the electronic circuit is supported by the support substrate, the first bonding layer is formed on the surface, on the support substrate side, of the semiconductor layer, whereas the second bonding layer is formed on the surface, on the semiconductor layer side, of the support substrate, and the first bonding layer and the second bonding layer are bonded to each other.

Here, either one of the first bonding layer and the second bonding layer has silicon carbide or silicon carbonitride.

According to a further embodiment of the present invention, there is provided a method of manufacturing a solid-state imaging apparatus, including the steps of: forming an electronic circuit having a light-receiving surface including photodiodes divided on the basis of each of pixels arranged in a matrix pattern on a surface on one side of a semiconductor substrate; forming a first bonding layer on the surface on one side of the semiconductor substrate; forming a second bonding layer on a surface on one side of a support substrate; adhering the first bonding layer and the second bonding layer to each other; a heat treatment for bonding the first bonding layer and the second bonding layer to each other; and thinning the semiconductor substrate to such an extent that light coming from a surface on the other side of the semiconductor substrate reaches the light-receiving surface, so as to form a semiconductor layer. In the manufacturing method, a layer having silicon carbide or silicon carbonitride is formed at a surface of at least either one of the first bonding layer and the second bonding layer, in at least either one of the first bonding layer forming step and the second bonding layer forming step.

In the solid-state imaging apparatus manufacturing method as above, the electric circuit is formed which has the light receiving surface including the photodiodes divided on the basis of each of the pixels arranged in a matrix pattern on the surface on one side of the semiconductor substrate. Next, the first bonding layer is formed on the surface on one side of the semiconductor substrate. On the other hand, the second bonding layer is formed on the surface on one side of the support substrate. Subsequently, the first bonding layer and the second bonding layer are adhered to each other, followed by a heat treatment to thereby bond the first bonding layer and the second bonding layer to each other. Next, the semiconductor substrate is thinned to such an extent that light coming from the surface on the other side of the semiconductor substrate reaches the light-receiving surface, so as to form a semiconductor layer.

Here, a layer having silicon carbide or silicon carbonitride is formed at a surface of at least either one of the first bonding layer and the second bonding layer, in at least one of the first bonding layer forming step and the second bonding layer forming step.

According to yet another embodiment of the present invention, there is provided a solid-state imaging apparatus including: a semiconductor layer provided with an electronic circuit having a light-receiving surface including photodiodes divided on the basis of each of pixels arranged in a matrix pattern; a support substrate supporting the semiconductor layer; a first bonding layer formed on a surface, on the support substrate side, of the semiconductor layer; and a second bonding layer which is formed on a surface, on the semiconductor layer side, of the support substrate and which is bonded to the first bonding layer; wherein either one of the first bonding layer and the second bonding layer has silicon carbide or silicon carbonitride.

In the solid-state imaging apparatus as above, the semiconductor layer provided with the electronic circuit having the light-receiving surface including the photodiodes divided on the basis of each of the pixels arranged in a matrix pattern is supported by the support substrate. The first bonding layer is formed on the surface, on the support substrate side, of the semiconductor layer, whereas the second bonding layer is formed on the surface, on the semiconductor layer side, of the support substrate, and the first bonding layer and the second bonding layer are bonded to each other.

Here, either one of the first bonding layer and the second bonding layer has silicon carbide or silicon carbonitride.

According to a still further embodiment of the present invention, there is provided a camera including: a solid-state imaging apparatus having a plurality of pixels integrated on a light-receiving surface; an optical system operable to guide incident light to an imaging unit of the solid-state imaging apparatus; and a signal processing circuit operable to process an output signal from the solid-state imaging apparatus. The solid-state imaging apparatus includes: a semiconductor layer provided with an electronic circuit having a light-receiving surface including photodiodes divided on the basis of each of pixels arranged in a matrix pattern; a support substrate supporting the semiconductor layer; a first bonding layer formed on a surface, on the support substrate side, of the semiconductor layer; and a second bonding layer which is formed on a surface, on the semiconductor layer side, of the support substrate and which is bonded to the first bonding layer, wherein either one of the first bonding layer and the second bonding layer has silicon carbide or silicon carbonitride.

The camera as above has the solid-state imaging apparatus having the plurality of pixels integrated on the light-receiving surface, the optical system for guiding incident light to an imaging unit of the solid-state imaging apparatus, and the signal processing circuit for processing the output signal from the solid-state imaging apparatus. Here, the solid-state imaging apparatus is a solid-state imaging apparatus according to an embodiment of the present invention that is configured as above-mentioned.

The method of manufacturing a bonded substrate according to an embodiment of the present invention is a method of manufacturing a bonded substrate in which either one of the first bonding layer and the second bonding layer constituting a faying surface has silicon carbide or silicon carbonitride. This makes it possible to obtain a high bonding strength by a bonding treatment carried out at a low temperature.

The bonded substrate according to another embodiment of the present invention is one in which either one of the first bonding layer and the second bonding layer constituting a faying surface in the bonded substrate has silicon carbide or silicon carbonitride. This ensures that the bonded substrate can be manufactured by carrying out a bonding treatment at a low temperature, and a high bonding strength can thereby be obtained.

The method of manufacturing a solid-state imaging apparatus according to a further embodiment of the present invention is a method of manufacturing a solid-state imaging apparatus using a bonded substrate, wherein either one of the first bonding layer and the second bonding layer constituting a faying surface has silicon carbide or silicon carbonitride. This makes it possible to obtain a high bonding strength by a bonding treatment carried out at a low temperature.

The solid-state imaging apparatus according to yet another embodiment of the present invention is a solid-state imaging apparatus using a bonded substrate, wherein either one of the first bonding layer and the second bonding layer constituting a faying surface has silicon carbide or silicon carbonitride. This ensures that the bonded substrate (and, hence, the solid-state imaging apparatus) can be manufactured while carrying out a bonding treatment at a low temperature, and a high bonding strength can thereby be obtained.

The camera according to a still further embodiment of the present invention has, as a component of the camera, a solid-state imaging apparatus using a bonded substrate, wherein either one of the first bonding layer and the second bonding layer constituting a faying surface in the bonded substrate has silicon carbide or silicon carbonitride. This ensures that the bonded substrate (and, hence, the solid-state imaging apparatus and, further, the camera, as well) can be manufactured while carrying out a bonding treatment at a low temperature, and a high bonding strength can thereby be obtained.

BRIEF DESCRIPTION OF THE DRAWINGS

FIG. 1 is a schematic sectional view of a bonded substrate according to a first embodiment of the present invention;

DETAILED DESCRIPTION OF THE PREFERRED EMBODIMENTS

Figure 2A:
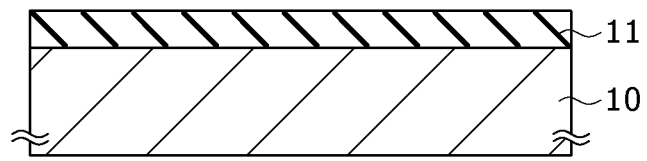
FIGS. 2A to 2D are schematic sectional views for illustrating manufacturing steps in a method of manufacturing the bonded substrate according to the first embodiment of the invention.

Now, embodiments of a method of manufacturing a bonded substrate, a bonded substrate manufactured thereby, a method of manufacturing a solid-state imaging apparatus, a solid-state imaging apparatus manufactured thereby, and a camera including the solid-state imaging apparatus, pertaining to an embodiment of the present invention, will be described below referring to the drawings.

The description will be made in the following order.
1. First Embodiment (Bonded substrate and method of manufacturing the same)
2. Example 1
3. Example 2
4. Second Embodiment (Solid-state imaging apparatus and method of manufacturing the same)
5. Example 3
6. Example 4
7. Third Embodiment (Camera using the solid-state imaging apparatus)
8. Fourth Embodiment (A bonded substrate wherein a semiconductor layer and a support substrate are provided with electronic circuits and are electrically connected to each other through contacts, and a method of manufacturing the same)
<First Embodiment>
[Configuration of Bonded Substrate]

FIG. 1 is a schematic sectional view of a bonded substrate according to this embodiment.

The bonded substrate according to this embodiment of the present invention has a configuration in which a semiconductor layer 10a is supported by a support substrate 20.

A first bonding layer 11 is formed on a surface, on the support substrate 20 side, of the semiconductor layer 10a. A second bonding layer 21 is formed on a surface, on the semiconductor layer 10a side, of the support substrate 20. The first bonding layer 11 and the second bonding layer 21 are bonded to each other.

Here, either one of the first bonding layer 11 and the second bonding layer 21 has silicon carbide or silicon carbonitride.

A faying surface (bonding surface or joint surface) between the first bonding layer 11 and the second bonding layer 21 has, for example, a configuration in which hydroxyl groups have been introduced into the surface of the first bonding layer 11 and the surface of the second bonding layer 21, and the first bonding layer 11 and the second bonding layer 21 have been bonded to each other by dehydration condensation effected in a heat treatment step.

For instance, the semiconductor layer 10a is provided with an electronic circuit (not shown).

Besides, in the case where the semiconductor layer 10a is not provided with an electronic circuit, a desired electronic circuit can be appropriately formed in or on the semiconductor layer 10a, like in the cases of ordinary SOI (Silicon On Insulator) type semiconductor substrates.

In addition, the semiconductor layer 10a can be additionally formed with an electronic circuit in connection with or independently of an electronic circuit already formed in or on the semiconductor layer 10a.

For example, the support substrate 20 is a semiconductor substrate of silicon or the like, and the support substrate 20 may also be provided with an electronic circuit.

In this case, if necessary, the electronic circuit of the support substrate 20 and the electronic circuit of the semiconductor layer 10a may be connected to each other through a contact or contacts.

For instance, a configuration can be adopted in which a contact hole or holes reaching the support substrate 20 are bored from the upper surface of the semiconductor layer 10a, and the two electronic circuits are connected to each other.

Or, alternatively, a configuration may be adopted in which a first contact penetrating the first bonding layer 11 and connected to the electronic circuit of the semiconductor layer 10a and a second contact penetrating the second bonding layer 21 and connected to the electronic circuit of the support substrate 20 are preliminarily provided, and the first contact and the second contact are connected to each other. This configuration will be described in detail in Fourth Embodiment later.

For example, at least a part of either one of the first bonding layer 11 and the second bonding layer 21 has a layer having silicon carbide or silicon carbonitride.

The expression "at least a part of either one of the first bonding layer 11 and the second bonding layer 21" used above means, for example, a surface served to bonding between the first bonding layer 11 and the second bonding layer 21.

For instance, in the case where the first contact penetrating the first bonding layer 11 and connected to the electronic circuit of the semiconductor layer 10a and the second contact penetrating the second bonding layer 21 and connected to the electronic circuit of the support substrate 20 are provided, the "at least a part of either one of the first bonding layer 11 and the second bonding layer 21" may be a region exclusive of the regions of the first contact and the second contact.

The other of the first bonding layer 11 and the second bonding layer 21 has, for example, a layer having silicon oxide, silicon nitride, silicon carbide, silicon carbonitride or the like. The material forming this layer is not particularly limited, and silicon carbide or silicon carbonitride can be preferably used as the material.

Thus, the bonded substrate in this embodiment has a configuration in which either one of the first bonding layer 11 and the second bonding layer 21 constituting the faying surface (bonding surface or joint surface) in the bonded substrate has silicon carbide or silicon carbonitride. This makes it possible to manufacture the bonded substrate and to obtain a high bonding strength, while carrying out a bonding treatment at a low temperature.

The reason why the just-mentioned effect can be obtained will be described later.
[Method of Manufacturing Bonded Substrate]

FIGS. 2A to 2D are schematic sectional views for illustrating manufacturing steps in a method of manufacturing the bonded substrate according to this embodiment.

First, as shown in FIG. 2A, a first bonding layer 11 is formed on a surface on one side of a semiconductor substrate 10.

Figure 2B:
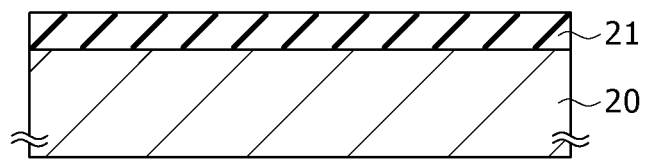

On the other hand, as shown in FIG. 2B, for example, a second bonding layer 21 is formed on a surface on one side of a support substrate 20.

Figure 2C:
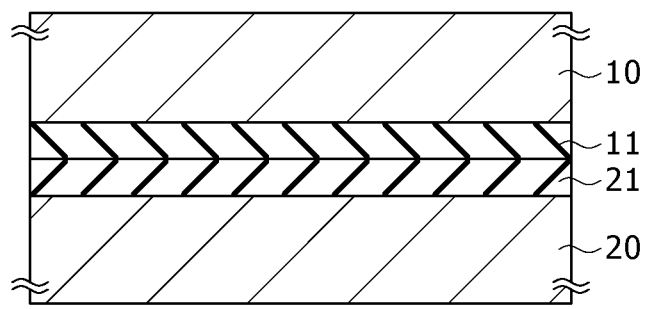

Next, as shown in FIG. 2C, for example, the surfaces of the first bonding layer 11 and the second bonding layer 21 are subjected to an oxygen plasma treatment and a water cleaning treatment, so as to introduce hydroxyl groups into the surfaces of the first bonding layer 11 and the second bonding layer 21, and thereafter the first bonding layer 11 and the second bonding layer 21 are adhered to each other.

Then, for example, a heat treatment is carried out, to effect dehydration condensation of the hydroxyl groups at the surfaces of the first bonding layer 11 and the second bonding layer 21, whereby the first bonding layer 11 and the second bonding layer 21 are bonded to each other.

Figure 2D:
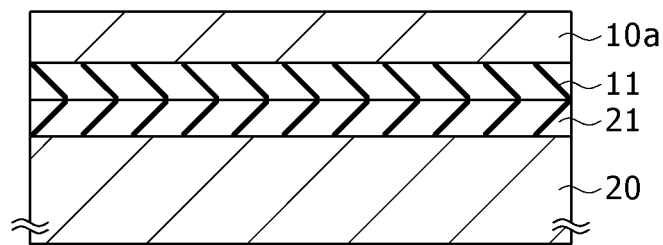

Subsequently, as shown in FIG. 2D, for example, the semiconductor substrate 10 is thinned from the surface on the other side of the semiconductor substrate 10, to convert the semiconductor substrate 10 to a semiconductor layer 10a.

In the foregoing, a layer having silicon carbide or silicon carbonitride is formed at the surface of at least either one of the first bonding layer and the second bonding layer, in at least either one of the step of forming the first bonding layer 11 and the step of forming the second bonding layer 21.

For instance, a step of forming a copper-containing layer on at least either one of the semiconductor substrate 10 and the support substrate 20 is further provided before the step of adhering the first bonding layer 11 and the second bonding layer 21 to each other, and the treating temperature in the heat treatment step is not more than 400° C.

The heat treatment for bonding the first bonding layer 11 and the second bonding layer 21 should be carried out at a temperature not higher than the heat-resistant temperature of copper, and is preferably conducted at or below 400° C., for example.

In addition, for example, a step of forming an aluminum-containing layer on at least either one of the semiconductor substrate 10 and the support substrate 20 is further provided before the step of adhering the first bonding layer 11 and the second bonding layer 21 to each other, and the treating temperature in the heat treatment step is not more than 500° C.

The heat treatment for bonding the first bonding layer 11 and the second bonding layer 21 should be performed at a temperature not higher than the heat-resistant temperature of aluminum, and is preferably carried out at or below 500° C., for example.

For instance, a step of forming an electronic circuit in or on at least one of the semiconductor substrate 10 and the support substrate 20 is further provided before the step of adhering the first bonding layer 11 and the second bonding layer 21 to each other.

The electronic circuit, normally, includes a wiring formed by use of the above-mentioned copper or aluminum or the like. In this case, as above-mentioned, the heat treatment for bonding the first bonding layer 11 and the second bonding layer 21 to each other is carried out at a temperature not higher than the heat-resistant temperature of copper or aluminum.

Besides, for example, the support substrate 20 is a semiconductor substrate of silicon or the like, and a step of forming an electronic circuit in or on each of the semiconductor substrate 10 and the support substrate 20 is further provided between the step of adhering the first bonding layer 11 and the second bonding layer 21 to each other.

In the just-mentioned case, also, the electronic circuit normally includes a wiring formed by use of copper or aluminum, so that the heat treatment for bonding the first bonding layer 11 and the second bonding layer 21 to each other is carried out at a temperature not higher than the heat-resistant temperature of copper or aluminum.

In addition, in the case where the electronic circuit of the semiconductor layer 10a is not formed, a desired electronic circuit can appropriately be formed in or on the semiconductor layer 10a, like in the cases of ordinary SOI type semiconductor substrates.

Besides, the semiconductor layer 10a can be additionally formed with an electronic circuit in connection with or independently of an electronic circuit already formed in or on the semiconductor layer 10a.

For example, a layer having silicon carbide or silicon carbonitride is formed at a surface of at least a part of at least either one of the first bonding layer 11 and the second bonding layer 21, in at least either one of the step of forming the first bonding layer 11 and the step of forming the second bonding layer 21.

The expression "at least a part of either one of the first bonding layer 11 and the second bonding layer 21" used above means, for example, a surface to be served to the bonding between the first bonding layer 11 and the second bonding layer 21.

Specifically, a layer having silicon carbide or silicon carbonitride is formed at a surface, served to bonding between the first bonding layer 11 and the second bonding layer 21, of at least either one of the first bonding layer 11 and the second bonding layer 21, in at least either one of the steps of forming the first bonding layer 11 and the second bonding layer 21.

For instance, in the case of providing the support substrate 20 also with an electronic circuit, if necessary, the electronic circuit of the support substrate 20 and the electronic circuit of the semiconductor layer 10a may be connected to each other through a contact or contacts.

For instance, a configuration can be adopted in which a contact hole or holes reaching the support substrate 20 are bored from the upper surface of the semiconductor layer 10a, and the two electronic circuits are connected to each other.

In the case where the first contact penetrating the first bonding layer 11 and the second contact penetrating the second bonding layer 21 are provided, the expression "a surface, served to bonding between the first bonding layer 11 and the second bonding layer 21" in the foregoing means, for example, an area exclusive of the areas of the first contact and the second contact.

In addition, a configuration may be adopted in which a first contact penetrating the first bonding layer 11 and connected to the electronic circuit of the semiconductor layer 10a and a second contact penetrating the second bonding layer 21 and connected to the electronic circuit of the support substrate 20 are provided. In this case, for example, the first contact and the second contact are electrically connected, attendant on the bonding between the first bonding layer 11 and the second bonding layer 21. This manufacturing method will be described in detail in Fourth Embodiment later.

The method of manufacturing a bonded substrate in this embodiment is a method of manufacturing a bonded substrate wherein either one of the first bonding layer and the second bonding layer constituting a faying surface has silicon carbide or silicon carbonitride, whereby a high bonding strength can be obtained while carrying out a bonding treatment at a low temperature.

The reason why the just-mentioned effect can be obtained will be described later.

[The Reason why a High Bonding Strength can be Obtained Through a Bonding Treatment Carried Out at a Low Temperature]

If the interatomic distance in the material constituting the faying surface is short, the intervals of hydroxyl groups produced upon surface modification are short and, therefore, the density of the hydroxyl groups in the surface is high.

Therefore, enhancement of the bonding strength attained in bonding by dehydration condensation at a low temperature can be achieved by forming the faying surface from a material having a short interatomic distance.

For instance, in order to enhance the bonding strength between silicon oxide grains at a low temperature, it suffices to ensure that at least one of the faying surfaces to be bonded to each other is formed by use of a material having a film density higher than the film density of silicon oxide.

In this embodiment, the material to be used here to form a film is any material that can form a film with an interatomic distance smaller than the interatomic distance of silicon oxide and that has such physical properties as to be capable of dehydration condensation.

Besides, the method of forming the film here is not particularly limited; for example, a chemical vapor deposition (CVD) method, a sputtering method, a coating method based on a sol-gel process, or the like can be used.

In addition, such a material is not limited to silicon compounds but may be any material that can form an insulation film usable in semiconductor apparatuses; for example, an insulation film formed by use of titanium, aluminum or the like may be used.

As a natural consequence, comparing bonding between materials both having short interatomic distances with bonding between a material having a short interatomic distance and a material not having a short interatomic distance, the bonding between the materials both having short interatomic distances leads to a higher bonding strength.

In the case of application to a semiconductor apparatus, it is easy to introduce a silicon nitride film, a silicon carbide film, or a silicon carbonitride film which are generally used as insulation films just like a silicon oxide film.

Further, it is intended in the present invention to enhance the bonding strength obtained through dehydration condensation. Therefore, in order to prevent water molecules produced upon dehydration condensation from being trapped in the faying surface to form voids, a film permeable to the water molecules is desirable.

As an insulation film fulfilling the above-mentioned properties, for example, a film of silicon carbonitride (hereinafter referred to as $SiC_xN_y$) obtained by introducing carbon into silicon nitride can be used particularly preferably.

The carbon-to-nitrogen ratio in the film is not particularly limited; for example, the ratio x:y in the chemical formula $SiC_xN_y$ is 5:5.

Besides, as the insulation film fulfilling the above-mentioned properties, for example, a film of silicon carbide can be used especially preferably.

Correlation between the density of hydroxyl groups introduced into the faying surface and the lattice constants in the material constituting the faying surface is as follows. Each of the films is less liable to form single crystals, and the single crystals can assume several kinds of structures.

Particularly, where a film is formed by a plasma enhanced CVD method, a polycrystalline structure is formed.

The lattice constants of quartz, which is a crystal of silicon oxide, for example in the case of $\alpha$-$SiO_2$, has an a-axis of 0.49 nm and a c-axis of 0.54 nm.

On the other hand, silicon nitride, for example in the case of $\beta$-$Si_3N_4$, has an a-axis of 0.78 nm, a c-axis of 0.29 nm. Silicon carbide SiC has an a-axis of 0.46 nm.

Comparison of lattice constants reveals that the lattice constants of silicon nitride may not necessarily be smaller than those of silicon oxide. However, it is considered that the density of hydroxyl groups formed in the surface is high, since the interatomic distance of Si—N is large, as will be described below.

The mean interatomic distances for the respective materials are 0.25 to 0.3 nm for silicon oxide, 0.174 nm for silicon nitride, and 0.188 nm for silicon carbide (see Non-Patent Document 1).

Silicon nitride or silicon carbide itself is high in density, and is extremely low in permeability to water molecules. Therefore, when silicon nitride or silicon carbide is used alone, the probability of generation of voids is high. In this aspect, bonding between silicon nitride films is not preferable, since water molecules are trapped in the faying surface.

In the case of a silicon nitride film, it suffices to lower the film density or to generate innumerable defects in the film so that the film can absorb water molecules, by regulating the method of forming the silicon nitride film.

In this case, mutual mixing of carbon and nitrogen makes it difficult to form a single solid phase, and such defects as to permit water molecules to enter therein are generated in the crystal. Consequently, generation of voids through dehydration condensation can be restrained.

In addition, the thickness of the film required here is any film thickness that permits absorption of water molecules generated. If this object is attained, the film thickness of 10 nm that is required in the case of a silicon oxide film for ordinary dehydration condensation bonding may not necessarily be needed.

EXAMPLE 1

In the same manner as in the first embodiment, as shown in FIG. 2A, a first bonding layer 11 was formed in a thickness of 100 nm on a surface of a semiconductor substrate 10 of silicon, as follows.

As the first bonding layer 11, a silicon oxide film was formed by chemical vapor deposition (CVD) using an ordinary plasma enhanced film forming apparatus. In the case of the silicon oxide film, the film was formed by introducing TEOS (Tetraethyl Orthosilicate) and oxygen into an Ar plasma (frequency: 13.56 MHz, pressure: 25 Pa, power: 200 W).

Similarly, as the first bonding layer 11, a silicon nitride film was formed by introducing silane and nitrogen. Or, a silicon carbonitride film was formed by introducing trimethoxysilane (TMS) and nitrogen. Or, a silicon carbide film was formed.

Next, as shown in FIG. 2B, the same semiconductor substrate of silicon as above was used as also a support substrate 20, and a second bonding layer 21 was formed in a thickness of 100 nm on a surface of the support substrate 20.

As the second bonding layer 21, a silicon oxide film, a silicon nitride film, a silicon carbonitride film, or a silicon carbide film was formed in the same manner as above.

The surface of the first bonding layer 11 formed as above was irradiated with an oxygen plasma under the conditions of a frequency of 13.56 MHz, a pressure of 10 Pa, and a power of 100 W for 60 seconds to modify the surface, and the surface was cleaned with pure water of not less than 18 MΩ for 30 seconds, to produce hydroxyl groups over the whole surface area of the first bonding layer 11.

The second bonding layer 21 was also subjected to an oxygen plasma treatment and a pure water cleaning treatment in the same manner as above, to produce hydroxyl groups over the whole surface area of the second bonding layer 21.

Next, as shown in FIG. 2C, the first bonding layer 11 and the second bonding layer 21 were made to face each other, and were adhered to each other by the van der Waals force by depressing a part of the substrate with a pin.

Subsequently, a heat treatment was conducted in a nitrogen atmosphere at the atmospheric pressure, to effect dehydration condensation of the hydroxyl groups at the surfaces of the first bonding layer 11 and the second bonding layer 21, whereby the first bonding layer 11 and the second bonding layer 21 were bonded to each other.

Here, in Samples 1 and 2, the first bonding layer and the second bonding layer were silicon oxide films.

In Samples 3 and 4, the first bonding layer was a silicon nitride film, and the second bonding layer was a silicon oxide film.

In Samples 5 and 6, the first bonding layer was a silicon carbonitride film, and the second bonding layer was a silicon oxide film.

In Samples 7 and 8, the first bonding layer was a silicon carbide film, and the second bonding layer was a silicon oxide film.

In Samples 9 and 10, the first bonding layer and the second bonding layer were silicon carbonitride films.

The bonding strength of each of the bonded samples was measured by the so-called four-point bending technique.

In the four-point bending method, the measurement was conducted in the following manner, as described in Non-Patent Document 2.

A specimen was prepared in which a layer including the bonding layers of which the bonding strength was to be measured was sandwiched between two silicon substrates having a thickness h. For example, the specimen was in a beam-like shape with a width b of about 3 mm, a length of about 30 mm, and a thickness (corresponding substantially to 2 h) of about 1.4 mm. Here, a notch extending from the surface of the silicon substrate on one side to reach the surface layer of the layer including the bonding layers was formed perpendicularly to the longitudinal direction of the specimen.

The specimen was loaded with a load P/2 at a total of four points. The four points composed of two outside loading points which were on the notched surface side and were equidistant from the notch, and two inside loading points which were on the back side of the notched surface, were located closer to the notch than the outside loading points and were equidistant from the notch.

From the load P/2, the distance L between the outside loading point and the inside loading point, the values of the specimen width b and the silicon substrate thickness h, and the elastic modulus E and Poisson's ratio v of the bulk silicon substrate, a debond driving force G was calculated by use of predetermined expressions described in Non-Patent Document 2 and the like.

Here, the value of the load applied was varied, to obtain a load-displacement curve. In this instance, crack was generated with the notch as a starting point, and a load plateau appeared in the load-displacement curve. From the plateau value thus obtained, a critical interface fracture energy $G_C$ (unit: $J/m^2$) was obtained, as a measurement indicative of the bonding strength of the bonding layers under measurement.

This measuring method was established as a method for accurate measurement in the case where the bonding strength to be measured is low. This method was adopted for making clear the subtle differences in bonding strength, concerning the purpose of the experiment.

Measurement results of bonding strength for the above-mentioned Samples 1 to 10 are shown in Table 1 below.

TABLE 1

| Sample | 1 | 2 | 3 | 4 | 5 |
|---|---|---|---|---|---|
| First bonding layer | Silicon oxide | Silicon oxide | Silicon nitride | Silicon nitride | Silicon carbonitride |
| Second bonding layer | Silicon oxide | Silicon oxide | Silicon oxide | Silicon oxide | Silicon oxide |
| Bonding strength [$J/m^2$] | 5.60 | 5.78 | 6.48 | 6.90 | Beyond upper limit of measurement |

| Sample | 6 | 7 | 8 | 9 | 10 |
|---|---|---|---|---|---|
| First bonding layer | Silicon carbonitride | Silicon carbide | Silicon carbide | Silicon carbonitride | Silicon carbonitride |
| Second bonding layer | Silicon oxide | Silicon oxide | Silicon oxide | Silicon carbonitride | Silicon carbonitride |
| Bonding strength [$J/m^2$] | Beyond upper limit of measurement | Beyond upper limit of measurement | Beyond upper limit of measurement | Beyond upper limit of measurement | Beyond upper limit of measurement |

In Samples 1 and 2, the bonding strength was about 5.6 to 5.7 $J/m^2$.

Besides, in Samples 3 and 4, the bonding strength was about 6.5 to 6.9 $J/m^2$.

In Samples 5, 6, 7, 8, 9 and 10, the bonding strength exceeded the upper limit of measurement on the four-point bend testing apparatus used for the measurement of 20 $J/m^2$, and was immeasurable.

From the above results, it is seen that the bonding strength tends to increase in the increasing order of [a combination of silicon oxide films], [a combination of silicon oxide film with silicon nitride film], and [a combination of silicon oxide film with silicon carbonitride film or a combination of silicon carbide film with silicon oxide film or a combination of silicon carbonitride films]. Thus, it was verified that the mechanism which had been presumed was being exhibited.

EXAMPLE 2

Substrate bonding was conducted in the same manner as in Example 1, except that substrates obtained by forming a film of aluminum, copper, silicon nitride or titanium nitride on a silicon substrate were used in place of the silicon substrate as the semiconductor substrate and the support substrate, and the bonding strengths of the bonded substrates obtained were compared.

In this case, also, the same results as in Table 1 above were obtained. Specifically, it was confirmed that the bonding strength depends on the bonding layers subjected to bonding, and does not depend on the properties of the under layers.

<Second Embodiment>
[Configuration of Solid-State Imaging Apparatus]

Figure 3:
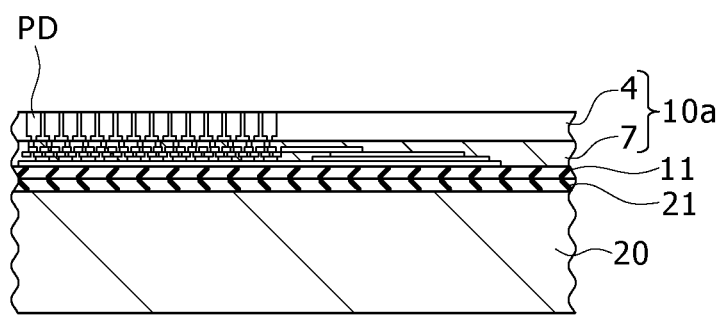
FIG. 3 is a schematic sectional view of a solid-state imaging apparatus according to a second embodiment of the invention.
Figure 4:
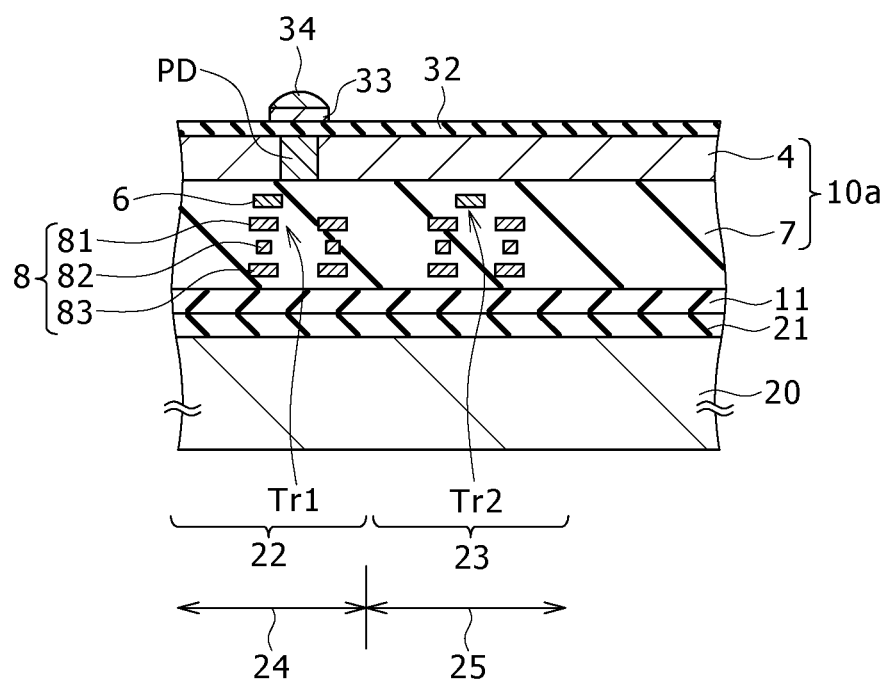
FIG. 4 is an enlarged view of a major part of the sectional view of the solid-state imaging apparatus according to the second embodiment of the invention.

FIG. 3 is a schematic sectional view of a CMOS image sensor which is a solid-state imaging apparatus according to this embodiment of the present invention, and FIG. 4 is an enlarged view of a major part of the sectional view of the solid-state imaging apparatus according to this embodiment. In FIG. 3, color filters and on-chip microlenses are omitted.

For example, as shown in FIGS. 3 and 4, a semiconductor region 4 of single crystal silicon or the like and an insulation layer 7 are stacked on each other. Hereinafter, the semiconductor region 4 and the insulation layer 7 will together be referred to as a semiconductor layer 10a.

In an imaging region 24, there is formed an electronic circuit having a light-receiving surface in which unit pixels 22 having one photo-electric conversion element (photodiode PD) and a plurality of MOS-type transistors Tr1 are arranged in a matrix pattern in the semiconductor region 4 in the state of being divided on the basis of each pixel. The photodiode PD is disposed on the side of a surface (the surface which is on the upper side in the figure, and which will be referred to as the "back-side surface") on one side of the semiconductor region 4.

In addition, in a peripheral region 25, a peripheral circuit section 23 having a plurality of CMOS-type transistors Tr2 is formed in the semiconductor region 4.

In the imaging region 24 and the peripheral region 25, the above-mentioned insulation layer 7 is formed on the side of a surface (the surface which is on the lower side in the figure, and which will be referred to as the "front-side surface") on the other side of the semiconductor region 4. Besides, a multi-layer wiring layer 8 (81, 82, 83) is formed in the insulation layer 7.

Incidentally, though not shown in the figure, a region in which to provide a pad for connection to an external wiring, for example, is formed other than the imaging region 24 and the peripheral region 25.

Each of the MOS-type transistors Tr1 formed in the unit pixel 22 has a configuration in which a gate electrode 6 is formed, through a gate insulation film, on a part between a pair of a source region and a drain region (both not shown) formed in the semiconductor region 4.

Besides, the CMOS-type transistor Tr2 of the peripheral circuit section 23 also has a configuration in which a gate electrode 6 is formed, through a gate insulation film, on a part between a pair of a source region and a drain region (both not shown) formed in the semiconductor region 4.

On the other hand, an insulation film 32 including, for example, an anti-reflection film, a flattening film or the like is formed on the back side of the semiconductor region 4, and, on the upper side thereof, on-chip lenses 34 are formed correspondingly to the photodiodes PD of the unit pixels 22, with the color filters 33 therebetween.

In the CMOS-type solid-state image sensor with such a configuration, when the photodiodes PD are illuminated with light incident from the back side of the semiconductor region 4 through the on-chip lenses 34, signal charges are produced on a pixel basis. Consequently, voltage signals or the like corresponding to the signal charge quantities are produced, and image signals are read with respect to all the pixels, whereby image data can be obtained.

The semiconductor layer 10a including the semiconductor region 4 and the insulation layer 7 is supported by the support substrate 20.

A first bonding layer 11 is formed on the surface, on the support substrate 20 side, of the semiconductor layer 10a. A second bonding layer 21 is formed on the surface, on the semiconductor layer 10a side, of the support substrate 20. The first bonding layer 11 and the second bonding layer 21 are bonded to each other.

Here, either one of the first bonding layer 11 and the second bonding layer 21 has silicon carbide or silicon carbonitride.

The faying surface (bonding surface or joint surface) between the first bonding layer 11 and the second bonding layer 21 has, for example, a configuration in which hydroxyl groups have been introduced into the surface of the first bonding layer 11 and the surface of the second bonding layer 21, followed by a heat treatment step to effect dehydration condensation, thereby bonding (joining) the first bonding layer 11 and the second bonding layer 21 to each other.

For example, the support substrate 20 may be a semiconductor substrate of silicon or the like, and the support substrate 20 may also be provided with an electronic circuit.

In this case, if necessary, the electronic circuit of the support substrate 20 and the electronic circuit of the semiconductor layer 10a may be connected to each other through a contact or contacts.

For instance, a configuration may be adopted in which a contact hole or holes reaching the support substrate 20 are bored from the upper surface of the semiconductor layer 10a, and the above-mentioned two electronic circuits are connected to each other.

Or, another configuration may be adopted in which a first contact penetrating the first bonding layer 11 and connected to the electronic circuit of the semiconductor layer 10a and a second contact penetrating the second bonding layer 21 and connected to the electronic circuit of the support substrate 20 are preliminarily provided, and the first contact and the second contact are connected to each other. This configuration will be described in detail in Fourth Embodiment later.

For example, at least a part of either one of the first bonding layer 11 and the second bonding layer 21 has a layer having silicon carbide or silicon carbonitride.

The expression "at least a part of either one of the first bonding layer and the second bonding layer" used here means, for example, a surface that is served to the bonding between the first bonding layer 11 and the second bonding layer 21.

For instance, in the case where the first contact penetrating the first bonding layer 11 and the second contact penetrating the second bonding layer 21 and connected to the electronic circuit of the support substrate 20 are provided, the "at least a part of either one of the first bonding layer and the second bonding layer" means a region exclusive of the regions of the first contact and the second contact.

The other of the first bonding layer 11 and the second bonding layer 21 has, for example, a layer having silicon oxide, silicon nitride, silicon carbide, silicon carbonitride or the like. The material of this layer is not particularly limited, and silicon carbide or silicon carbonitride can be used preferably.

The solid-state imaging apparatus according to this embodiment has a configuration wherein either one of the first bonding layer and the second bonding layer constituting the faying surface in the solid-state imaging apparatus using the bonded substrate has silicon carbide or silicon carbonitride. This ensures that the bonded substrate (and, hence, the solid-state imaging apparatus) can be manufactured while carrying out a bonding treatment at a low temperature, and a high bonding strength can thereby be obtained.

[Method of Manufacturing Solid-state Imaging Apparatus]

Now, a method of manufacturing the solid-state imaging apparatus configured as above will be described below, referring to FIGS. 5A to 8B.

FIGS. 5A to 8B are schematic sectional views for illustrating manufacturing steps in a method of manufacturing the solid-state imaging apparatus according to this embodiment. Incidentally, the parts corresponding to those in FIGS. 3 and 4 above are denoted by the same reference symbols as used above.

Figure 5A:
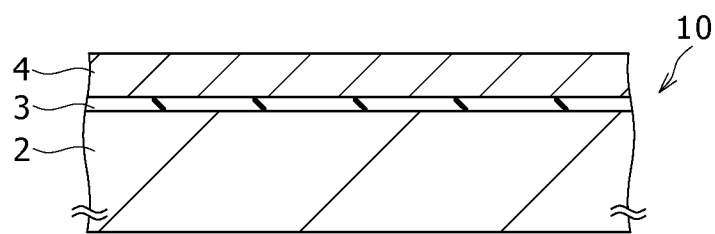
FIGS. 5A to 5C are schematic sectional views for illustrating manufacturing steps in a method of manufacturing the solid-state imaging apparatus according to the second embodiment of the invention.

First, as shown in FIG. 5A, an SOI-type semiconductor substrate 10 is prepared in which a semiconductor region 4 of single crystal silicon is formed over, for example, a silicon substrate 2, with a buried insulation layer (so-called BOX layer) 3 therebetween.

Incidentally, the thicknesses of the buried insulation film 3 and the semiconductor region 4 can be set arbitrarily.

Figure 5B:
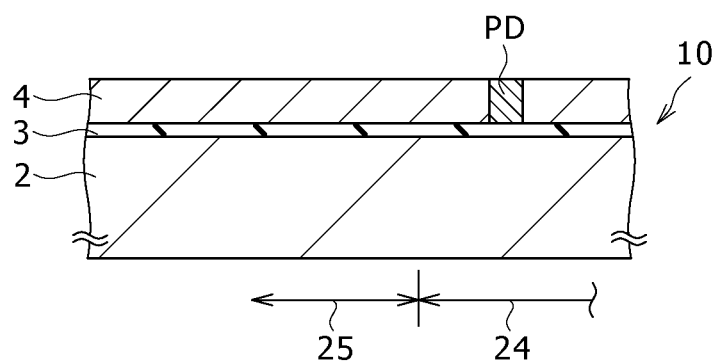

Next, as shown in FIG. 5B, in an imaging region 24, a photodiode PD is formed at a predetermined position in the semiconductor region 4 at a surface on one side of the SOI-type semiconductor substrate 10.

Figure 5C:
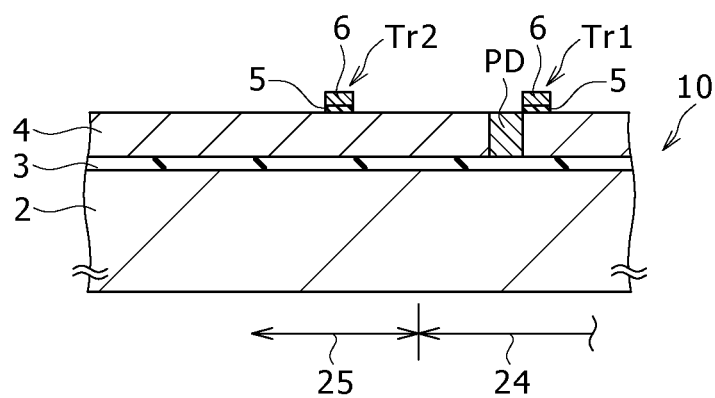

Subsequently, as shown in FIG. 5C, gate electrodes 6 are formed over the imaging region 24 and a peripheral region 25 of the semiconductor region 4, with a gate insulation layer 5 therebetween. Further, a pair of a source region and a drain region are formed at the surface of the semiconductor region 4, on both lateral sides of each of the gate electrodes 6, whereby a MOS-type transistor Tr1 and a CMOS-type transistor Tr2 are formed.

Figure 6A:
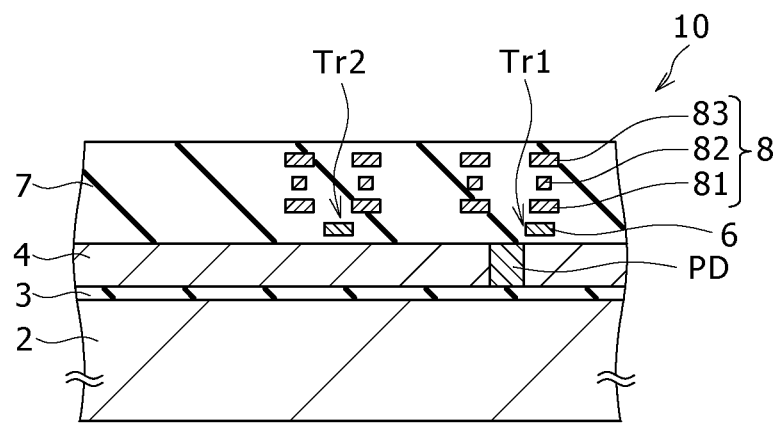
FIGS. 6A and 6B are schematic sectional views for illustrating manufacturing steps in the method of manufacturing the solid-state imaging apparatus according to the second embodiment of the invention.

Next, as shown in FIG. 6A, an insulation layer 7 is formed on the imaging region 24 and the peripheral region 25 of the semiconductor region 4, and a multi-layer wiring layer 8 is formed in the state of being buried in the insulation layer 7.

Specifically, first, the insulation layer 7 is formed on the imaging region 24 and the peripheral region 25 of the semiconductor region 4, followed by a flattening (planarizing) treatment. Thereafter, a wiring 81 as a first layer (of the multi-layer wiring layer 8) is formed in a predetermined pattern.

Subsequently, the insulation layer 7 is again formed over the whole area so as to contain the first-layer wiring 81 and an electrode layer 29, followed by a flattening treatment. Then, a wiring 82 as a second layer is formed in a predetermined pattern.

Next, the insulation layer 7 is again formed over the whole area so as to contain the second-layer wiring 82, followed by a flattening treatment. Thereafter, a wiring 83 as a third layer is formed in a predetermined pattern.

Incidentally, while the wiring layer 8 is shown to have a three-layer structure in FIG. 6A, such a step is further repeated in the case where the wiring layer 8 has more than three layers.

Besides, after the above-mentioned steps, a flattening film having, for example, a SiN film, a SiON film or the like may be formed on the insulation layer 7.

Figure 6B:
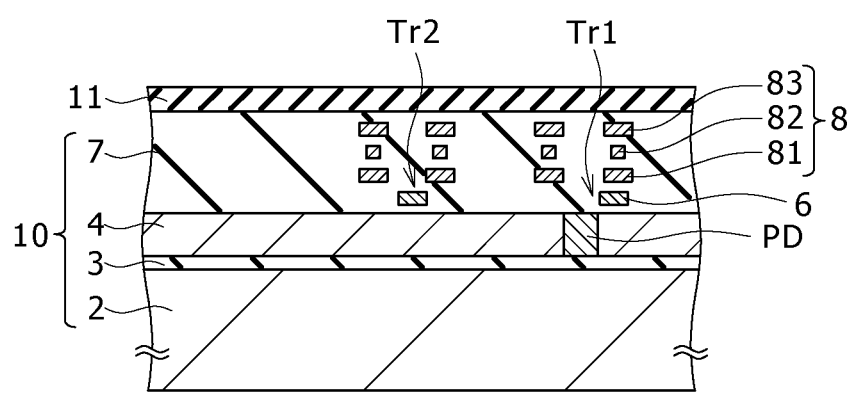

Subsequently, as shown in FIG. 6B, a first bonding layer 11 is formed on the insulation layer 7.

Figure 7A:
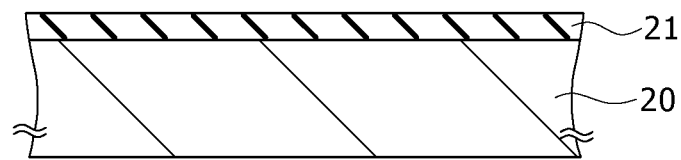
FIGS. 7A and 7B are schematic sectional views for illustrating manufacturing steps in the method of manufacturing the solid-state imaging apparatus according to the second embodiment of the invention.

On the other hand, as shown in FIG. 7A, for example, a second bonding layer 21 is formed on a surface on one side of a support substrate 20.

Figure 7B:
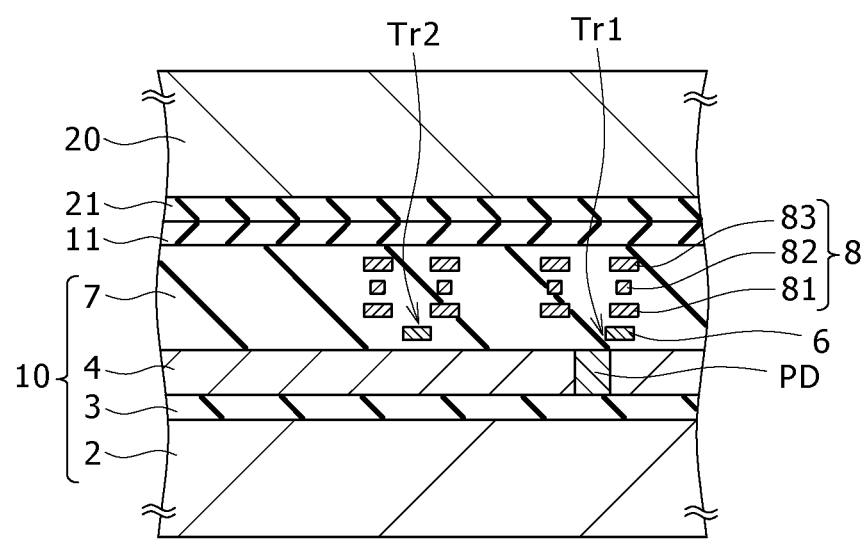

Next, as shown in FIG. 7B, for example, the surfaces of the first bonding layer 11 and the second bonding layer 21 are subjected to an oxygen plasma treatment and a water cleaning treatment, thereby introducing hydroxyl groups into the surfaces of the first bonding layer 11 and the second bonding layer 21. Thereafter, the first bonding layer 11 and the second bonding layer 21 are adhered to each other.

Subsequently, for example, a heat treatment is conducted, to effect dehydration condensation of the hydroxyl groups at the surfaces of the first bonding layer 11 and the second bonding layer 21, thereby bonding the first bonding layer 11 and the second bonding layer 21 to each other.

Figure 8A:
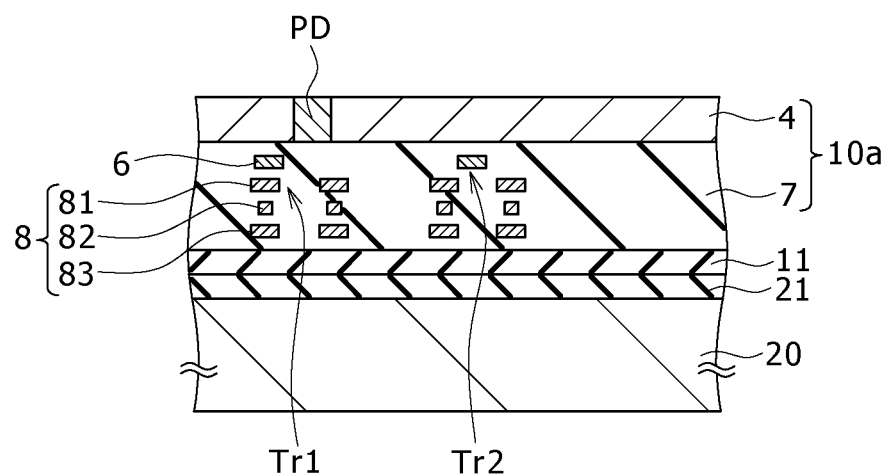
FIGS. 8A and 8B are schematic sectional views for illustrating manufacturing steps in the method of manufacturing the solid-state imaging apparatus according to the second embodiment of the invention.

Next, as shown in FIG. 8A, for example, the semiconductor substrate 10 is thinned from the side of a surface (back-side surface, silicon substrate 2) on the other side of the semiconductor substrate 10, to form a semiconductor layer 10a having a thickness of about 15 to 20 nm, for example. Incidentally, FIG. 8A is upside down in relation to FIG. 7B.

Consequently, as shown in FIG. 8A, the semiconductor region 4 having constituted the SOI-type semiconductor substrate 10 is exposed.

Incidentally, the thinning can be carried out not only by back grinding but also by CMP, wet etching or the like.

Figure 8B:
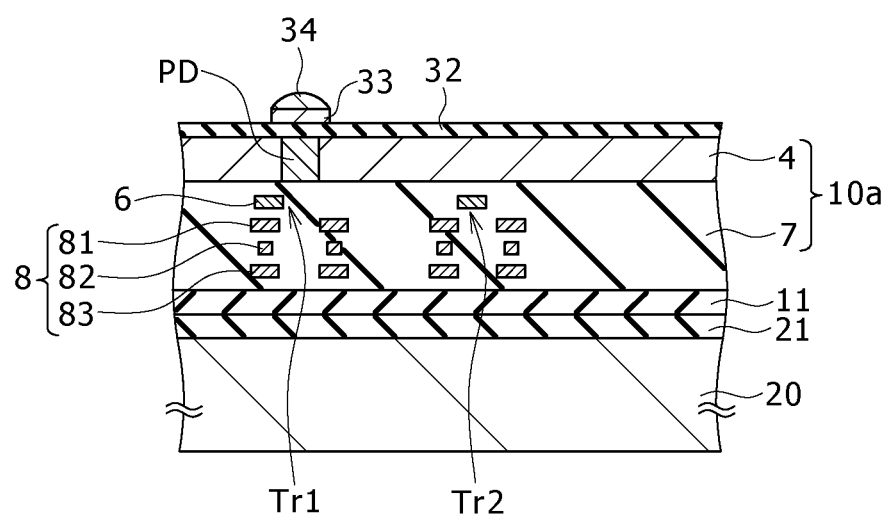

Then, as shown in FIG. 8B, for example, an insulation film 32 including an anti-reflection film or a flattening film or the like is formed on a surface (back-side surface) on the other side of the semiconductor region 4.

An on-chip lens 34 is formed over the insulation film 32 correspondingly to the photodiode PD of each unit pixel 22, with a color filter 33 therebetween.

In this manner, a CMOS-type solid-state imaging apparatus of the back-illuminated type shown in FIGS. 3 and 4 can be manufactured.

In the foregoing, in at least either one of the step of forming the first bonding layer 11 and the step of forming the second bonding layer 21, a layer having silicon carbide or silicon carbonitride is formed at a surface of at least either one of the first bonding layer 11 and the second bonding layer 21.

For example, a step of forming a copper-containing layer on at least either one of the semiconductor substrate 10 and the support substrate 20 is further provided before the step of adhering the first bonding layer 11 and the second bonding layer 21 to each other, and a treating temperature in a heat treatment step is not more than 400° C.

The heat treatment for bonding the first bonding layer 11 and the second bonding layer 21 to each other should be conducted at a temperature not higher than the heat-resistant temperature of copper, and is preferably carried out at or below 400° C., for example.

In addition, for example, a step of forming an aluminum-containing layer on at least either one of the semiconductor substrate 10 and the support substrate 20 is further provided before the step of adhering the first bonding layer 11 and the second bonding layer 21 to each other, and a treating temperature in a heat treatment step is not more than 500° C.

The heat treatment for bonding the first bonding layer 11 and the second bonding layer 21 to each other should be performed at a temperature not higher than the heat-resistant temperature of aluminum, and is preferably carried out at or below 500° C., for example.

Besides, for example, the support substrate 20 is a semiconductor substrate of silicon or the like, and a step of forming an electronic circuit in or on each of the semiconductor substrate 10 and the support substrate 20, other than the above-mentioned electronic circuit of the semiconductor substrate 10, is further provided before the step of adhering the first bonding layer 11 and the second bonding layer 21 to each other.

In the above-mentioned case, also, a wiring of copper or aluminum or the like is normally included, and the heat treatment for bonding the first bonding layer 11 and the second bonding layer 21 to each other is conducted at a temperature not higher than the heat-resistant temperature of copper or aluminum.

Incidentally, while the case of removing the silicon substrate 2 and the buried insulation film 3 to expose the semiconductor region 4 of the SOI-type semiconductor substrate 10 has been shown in the manufacturing steps shown in FIGS. 5A to 8B, it is also possible to remove only the silicon substrate 2 while leaving the buried insulation film 3.

The method of manufacturing a solid-state imaging apparatus in this embodiment is a method of manufacturing a solid-state imaging apparatus wherein either one of the first bonding layer and the second bonding layer constituting the faying surface has silicon carbide or silicon carbonitride, whereby a high bonding strength can be obtained while carrying out a bonding step at a low temperature.

EXAMPLE 3

After semiconductor devices were formed on the semiconductor substrate according to the second embodiment above, the semiconductor substrate was bonded to the support substrate, to produce a solid-state image sensor of the back-illuminated type.

In an ordinary image sensor, incident light would be absorbed or reflected by circuit elements or a wiring layer or the like formed on the front side, resulting in that the photo-electric conversion efficiency for the incident light is low and the sensitivity is low.

As a configuration for solving this problem, the back-illuminated type solid-state image sensor has been developed and has been disclosed in Patent Document 4 and the like.

Specifically, circuit elements and a wiring or the like are formed on the front side of the semiconductor substrate, photodiodes are formed on the back side of the semiconductor substrate, and light is made to be incident from the back side of the semiconductor substrate. This configuration ensures a high numerical aperture for light reception and suppresses absorption or reflection of the incident light.

In the past, an attempt to directly bond a faying surface at which a wiring layer and the like are present to a support substrate has been difficult to accomplish, because of the recesses and projections (or ruggedness) present at the faying surface. Therefore, for example in Patent Document 4 and the like, bonding by use of an adhesive has been generally attempted.

In view of this, in this embodiment, an oxide film using TEOS was formed on the wiring layer by plasma enhanced CVD, which is the method shown in Example 1.

The surface having the roughness was subjected to CMP (Chemical Mechanical Polishing), so as to polish the surface until a roughness permitting direct bonding to the support substrate is obtained, specifically, until a micro-roughness (RMS) of the surface is reduced to 0.5 nm or below.

On the support substrate, a silicon nitride film needed for the step of the solid-state image sensor was formed, and a silicon carbonitride film was formed thereon.

Both the semiconductor devices and the support substrate were subjected to the irradiation with plasma for surface modification shown in Example 1 and to bonding, so as to achieve tentative bonding between the substrates, followed by a heat treatment at 400° C., thereby completing the bonding.

After the semiconductor device side of the substrate thus bonded was thinned by grinding from the back side, color filters and on-chip lenses and the like equivalent to those in an ordinary solid-state image sensor were formed, to complete the solid-state image sensor of the back-illuminated type.

In this instance, in the case of adhesion by use of silicon oxide films at the faying surface, the insufficient bonding strength would lead to generation of minute voids, which are often called "microvoids." In the case of using the faying surface according to an embodiment of the present invention, however, no microvoid was generated. This contributes to enhancement of reliability as a semiconductor apparatus in the adhesion area.

In addition, since the bonding strength is high, there is no need for special considerations as to the substrates thus adhered. Thus, the semiconductor apparatus could be produced, without need to modify the steps having been carried out in the related art to manufacture a front-illuminated type solid-state image sensor.

EXAMPLE 4

Semiconductor devices were bonded to each other while adhering substrates to each other in the same manner as in Example 3, except that the semiconductor device in Example 3 was replaced by a general semiconductor circuit and that the support substrate was not a substrate alone but was a substrate provided thereon with semiconductor circuits.

In this case, the semiconductor devices on the substrate on the support substrate side were brought into adhesion by forming a silicon carbonitride film by plasma enhanced CVD after applying CMP to a silicon oxide film, in the same manner as in the case of the solid-state image sensor in Example 3 above.

In addition, simultaneously, the adhesion was conducted after optical alignment. This made it possible to form contact vias as wiring for connection between an upper circuit (an electronic circuit on the semiconductor substrate side) and a lower circuit (an electronic circuit on the support substrate side) after thinning the upper substrate from the back side thereof.

In this example, the semiconductor devices are formed in two layers. However, third and latter layers can be stacked by a procedure in which after the formation of the two layers, a silicon oxide film is further formed by plasma enhanced CVD and, after CMP, a silicon carbonitride film is formed.

<Third Embodiment>
[Camera Using Solid-state Imaging Apparatus]

Figure 9:
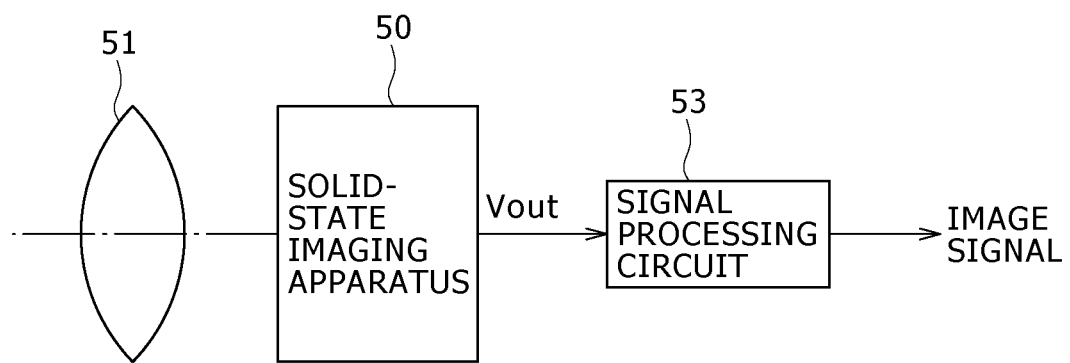
FIG. 9 is a schematic block diagram of a camera according to a third embodiment of the invention.

FIG. 9 is a schematic block diagram of a camera according to this embodiment.

The camera includes a solid-state imaging apparatus 50 having a plurality of pixels integrated, an optical system 51, and a signal processing circuit 53.

In this embodiment, as the solid-state imaging apparatus 50, a solid-state imaging apparatus pertaining to either of the first embodiment and the second embodiment above is incorporated.

The optical system 51 leads image light (incident light), coming from a subject, to form an image on an imaging surface in the solid-state imaging apparatus 50. Consequently, at photodiodes constituting pixels on the imaging surface in the solid-state imaging apparatus 50, the image is converted into signal charges according to the quantities of the incident light, and the signal charges are accumulated for a certain period.

The signal charges thus accumulated are guided, for example, through a CCD charge transfer path, to be taken out as an output signal Vout.

The signal processing circuit 53 applies various signal processing treatments to the output signal Vout from the solid-state imaging apparatus 50, and outputs the thus processed signal as an image signal.

In the camera in this embodiment, either one of the first bonding layer and the second bonding layer constituting a faying surface in the solid-state imaging apparatus using a bonded substrate constituting the camera has silicon carbide or silicon carbonitride. This makes it possible to manufacture the bonded substrate (and, hence, the solid-state imaging apparatus and, further, the camera) and to obtain a high bonding strength, while carrying out a bonding treatment at a low temperature.

<Fourth Embodiment>
[Configuration of Bonded Substrate]

Figure 10:
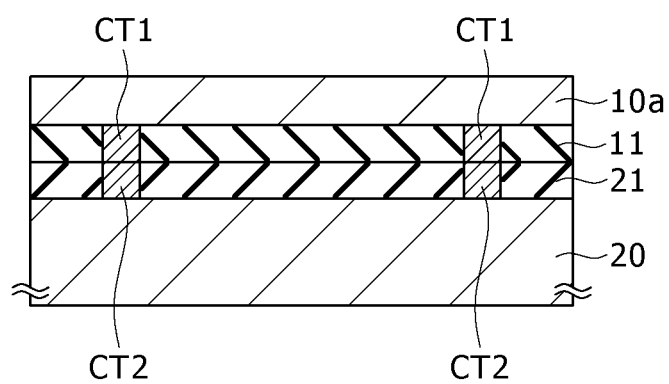
FIG. 10 is a schematic sectional view of a bonded substrate according to a fourth embodiment of the invention.

FIG. 10 is a schematic sectional view of a bonded substrate according to this embodiment.

The bonded substrate according to an embodiment of the present invention as above has a semiconductor layer 10a supported by a support substrate 20.

A first bonding layer 11 is formed on a surface, on the support substrate 20 side, of the semiconductor layer 10a, whereas a second bonding layer 21 is formed on a surface, on the semiconductor layer 10a side, of the support substrate 20. The first bonding layer 11 and the second bonding layer 21 are bonded to each other.

Here, either one of the first bonding layer 11 and the second bonding layer 21 has silicon carbide or silicon carbonitride.

A faying surface between the first bonding layer and the second bonding layer has, for example, a configuration in which hydroxyl groups have been introduced into the surface of the first bonding layer 11 and the surface of the second bonding layer 21, followed by a heat treatment step to effect dehydration condensation and thereby to bond the first bonding layer 11 and the second bonding layer 21 to each other.

For instance, the semiconductor layer 10a is provided with electronic circuits (not shown). In addition, the support substrate 20 is a semiconductor substrate of silicon or the like, and the support substrate 20 is also provided with electronic circuits.

In this embodiment, first contacts CT1 penetrating the first bonding layer 11 and connected to the electronic circuits of the semiconductor layer 10a and second contacts CT2 penetrating the second bonding layer 21 and connected to the electronic circuits of the support substrate 20, are formed. The first contacts CT1 and the second contacts CT2 are connected to each other.

For example, at least a part of either one of the first bonding layer 11 and the second bonding layer 21 has a layer having silicon carbide or silicon carbonitride.

In this embodiment, the expression "at least a part of either one of the first bonding layer 11 and the second bonding layer 21" means a region exclusive of the regions of the first contacts and the second contacts.

The other of the first bonding layer 11 and the second bonding layer 21 has, for example, a layer having silicon oxide, silicon nitride, silicon carbide, silicon carbonitride or the like. In this case, the material of the layer under consideration is not particularly limited; for example, silicon carbide or silicon carbonitride can be used preferably.

In the bonded substrate in this embodiment, either one of the first bonding layer 11 and the second bonding layer 21 constituting the faying surface of the bonded substrate has silicon carbide or silicon carbonitride. This makes it possible to manufacture the bonded substrate and to obtain a high bonding strength, while carrying out a bonding treatment at a low temperature.

[Method of Manufacturing Bonded Substrate]

FIGS. 11A to 12B are schematic sectional views for illustrating manufacturing steps in a method of manufacturing the bonded substrate according to this embodiment.

Figure 11A:
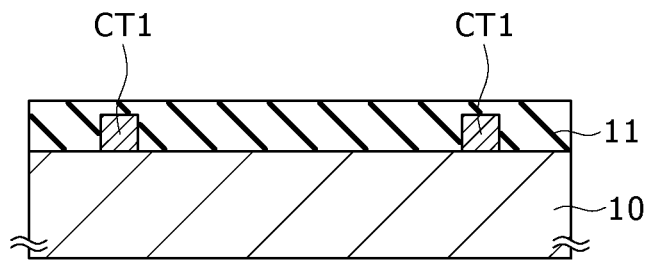
FIGS. 11A to 11D are schematic sectional views for illustrating manufacturing steps in a method of manufacturing the bonded substrate according to the fourth embodiment of the invention.

First, as shown in FIG. 11A, a semiconductor substrate 10 is provided with electronic circuits (not shown), and is formed with first contacts CT1 in connection with the electronic circuits.

Next, a first bonding layer 11 is formed over the whole surface so as to cover the first contacts CT1.

Figure 11B:
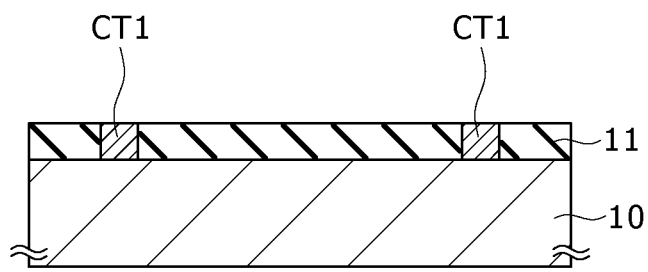

Subsequently, as shown in FIG. 11B, for example, removal of the first bonding layer 11 by a CMP treatment or the like is conducted from the upper side until the first contacts CT1 are exposed.

Figure 11C:
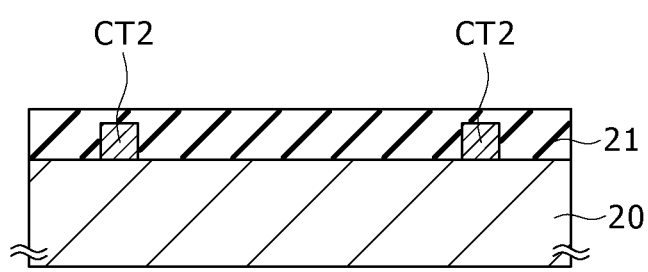

On the other hand, as shown in FIG. 11C, for example, a support substrate 20 is provided with electronic circuits (not shown), and is formed with second contacts CT2 in connection with the electronic circuits.

Next, a second bonding layer 21 is formed over the whole surface so as to cover the second contacts CT2.

Figure 11D:
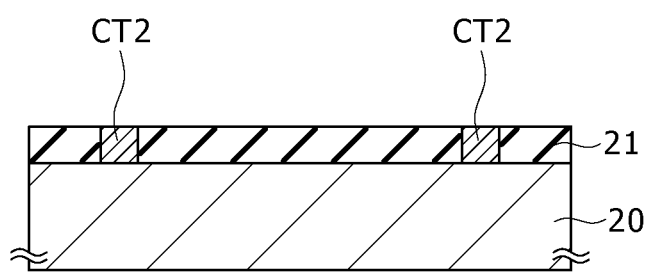

Subsequently, as shown in FIG. 11D, for example, removal of the second bonding layer 21 by a CMP treatment or the like is conducted from the upper side until the second contacts CT2 are exposed.

Figure 12A:
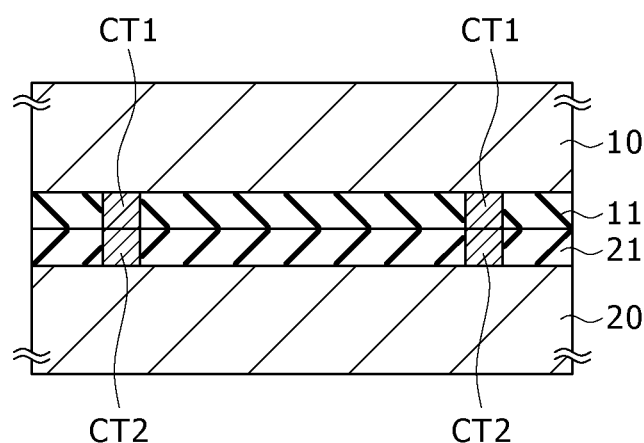
FIGS. 12A and 12B are schematic sectional views for illustrating manufacturing steps in the method of manufacturing the bonded substrate according to the fourth embodiment of the invention.

Next, as shown in FIG. 12A, for example, the surfaces of the first bonding layer 11 and the second bonding layer 21 are subjected to an oxygen plasma treatment and a water cleaning treatment, to introduce hydroxyl groups into the surfaces of the first bonding layer 11 and the second bonding layer 21, and thereafter the first bonding layer 11 and the second bonding layer 21 are adhered to each other.

A heat treatment, for example, is then conducted to effect dehydration condensation of the hydroxyl groups at the surfaces of the first bonding layer 11 and the second bonding layer 21, whereby the first bonding layer 11 and the second bonding layer 21 are bonded to each other.

Attendant on the bonding, the first contacts CT1 and the second contacts CT2 are electrically connected to each other, whereby the electronic circuits on the semiconductor substrate 10 side and the electronic circuits on the support substrate 20 side are connected to each other.

Figure 12B:
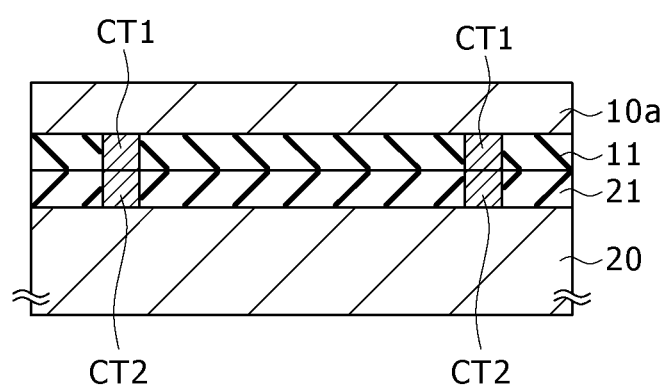

Subsequently, as shown in FIG. 12B, for example, the semiconductor substrate 10 is thinned from the other-side surface of the semiconductor substrate 10, to be a semiconductor layer 10a.

In the foregoing, in at least either one of the step of forming the first bonding layer 11 and the step of forming the second bonding layer 21, a layer having silicon carbide or silicon carbonitride is formed at a surface of at least either one of the first bonding layer 11 and the second bonding layer 21.

For example, a step of forming a copper-containing layer on at least either one of the semiconductor substrate 10 and the support substrate 20 is further provided before the step of adhering the first bonding layer 11 and the second bonding layer 21 to each other, and a treating temperature in the heat treatment step is not more than 400° C.

The heat treatment for bonding the first bonding layer 11 and the second bonding layer 21 to each other should be conducted at a temperature not higher than the heat-resistant temperature of copper, and is preferably carried out at or below 400° C., for example.

In addition, a step of forming an aluminum-containing layer on at least either one of the semiconductor substrate 10 and the support substrate 20 is further provided before the step of adhering the first bonding layer 11 and the second bonding layer 21 to each other, and a treating temperature in the heat treatment step is not more than 500° C.

The heat treatment for bonding the first bonding layer 11 and the second bonding layer 21 to each other should be conducted at a temperature not higher than the heat-resistant temperature of aluminum, and is preferably carried out at or below 500° C., for example.

For instance, in at least either one of the step of forming the first bonding layer 11 and the step of forming the second bonding layer 21, a layer having silicon carbide or silicon carbonitride is formed at a surface of at least a part of at least either one of the first bonding layer 11 and the second bonding layer 21.

The above-mentioned "at least a part of either one of the first bonding layer 11 and the second bonding layer 21" means, for example, a surface to be served to bonding between the first bonding layer 11 and the second bonding layer 21.

In this embodiment, the surface to be served to bonding between the first bonding layer 11 and the second bonding layer 21 is a region exclusive of the regions of the first contacts CT1 and the second contacts CT2.

The method of manufacturing the bonded substrate according to this embodiment is a method of manufacturing a bonded substrate wherein either one of a first bonding layer and a second bonding layer constituting a faying surface has silicon carbide or silicon carbonitride, whereby a high bonding strength can be obtained while carrying out a bonding treatment at a low temperature.

The bonded substrate and the manufacturing method therefor in this embodiment as above-described is applicable to a solid-state imaging apparatus, a method of manufacturing the same, and a camera, in the same manner as in the second embodiment and the third embodiment above.

The present invention is not limited to the above descriptions.

For instance, while the concept of the solid-state imaging apparatus has been applied to a CMOS image sensor in the above embodiments, it is applicable to a CCD device, as well. In the case of a CCD device, a signal reading unit has a configuration in which a charge coupled device (CCD) is connected to the photodiodes. In the CCD, signal charges transferred from pixels are read.

Besides, the bonded substrate according to embodiments of the present invention is applicable as a bonded substrate for constituting general semiconductor apparatuses other than the solid-state imaging apparatus.

It should be understood by those skilled in the art that various modifications, combinations, sub-combinations and alternations may occur depending on design requirements and other factors insofar as they are within the scope of the appended claims or the equivalent thereof.

What is claimed is:

1. A device comprising:
   a semiconductor layer having an electronic circuit;
   a support substrate supporting the semiconductor layer;
   a first bonding layer formed on a surface of and in direct physical contact with the semiconductor layer at the support substrate side; and
   a second bonding layer formed on a surface of the support substrate at the semiconductor layer side and which is bonded to the first bonding layer,
   wherein both the first bonding layer and the second bonding layer have silicon carbonitride, and
   a layer having silicon carbonitride formed at a surface of at least a part of at least one of the first bonding layer and the second bonding layer.

2. The device according to claim 1, wherein an electronic circuit is also formed in or on the support substrate.

3. The device according to claim 1, wherein the layer having silicon carbonitride is formed at the surface, to bond the first bonding layer and the second bonding layer, of at least either one of the first bonding layer and the second bonding layer, in at least either one of the first bonding layer forming step and the second bonding layer forming step.

4. The device according to claim 3, further comprising:
   a first contact penetrating the first bonding layer and connected to the electronic circuit of the semiconductor substrate, and a second contact penetrating the second bonding layer and connected to an electronic circuit of the support substrate,
   wherein the layer having silicon carbonitride is formed at a surface of an area, exclusive of the areas of the first contact and the second contact, of at least either one of the first bonding layer and the second bonding layer, and
   the first contact and the second contact are electrically connected to each other.

5. An imaging apparatus, comprising:
   an electronic circuit having a light-receiving surface including photodiodes divided on a basis of each pixel of a plurality of pixels arranged in a matrix pattern on a surface of one side of a semiconductor substrate;
   a first bonding layer on the surface of and in direct physical contact with one side of the semiconductor substrate;
   a second bonding layer on a surface of one side of a support substrate, and
   a layer having silicon carbonitride formed at a surface of at least a part of at least one of the first bonding layer and the second bonding layer,
   wherein the first bonding layer and the second bonding layer are adhered to each other,
   wherein the first bonding layer and the second bonding layer are bonded to each other,
   wherein a thickness of the semiconductor substrate is such that light coming from a surface on an other side of the semiconductor substrate reaches the light-receiving surface, so as to form a semiconductor layer, and wherein a layer having silicon carbonitride is formed at a surface of both the first bonding layer and the second bonding layer.

6. An imaging apparatus comprising:
a semiconductor layer provided with an electronic circuit having a light-receiving surface including photodiodes divided on a basis of pixels arranged in a matrix pattern;
a support substrate supporting the semiconductor layer;
a first bonding layer formed on a surface of and in direct physical contact with the semiconductor layer at the support substrate side;
a second bonding layer formed on a surface of the support substrate at the semiconductor layer side and which is bonded to the first bonding layer; and
a layer having silicon carbonitride formed at a surface of at least a part of at least one of the first bonding layer and the second bonding layer,
wherein both the first bonding layer and the second bonding layer have silicon carbonitride.

7. The apparatus of claim 6, further comprising:
an insulation layer on the support substrate side of the semiconductor layer, wherein the insulation layer is between the first bonding layer and the semiconductor layer.

8. The apparatus of claim 7, wherein the insulation layer includes a plurality of wirings.

9. The apparatus of claim 8, further comprising:
an electronic circuit formed in or on the semiconductor layer.

10. The apparatus of claim 7, further comprising:
an optical system operable to guide incident light to an imaging unit of the imaging apparatus.

11. The apparatus of claim 10, further comprising:
a signal processing circuit operable to process an output signal from the plurality of pixels.

12. The apparatus of claim 6, wherein hydroxyl groups are introduced into a surface of the first bonding layer and a surface of the second bonding layer.

13. The apparatus of claim 6, wherein the first bonding layer and the second bonding layer are bonded to each other by dehydration condensation during the heat treatment.

14. The apparatus of claim 6, further comprising:
a copper-containing layer on at least either one of the semiconductor layer and the support substrate.

15. The apparatus of claim 6, further comprising:
an aluminum-containing layer on at least either one of the semiconductor layer and the support substrate.

16. The apparatus of claim 6, further comprising:
a first contact penetrating the first bonding layer and connected to an electronic circuit of the semiconductor layer, and a second contact penetrating the second bonding layer and connected to an electronic circuit of the support substrate.

17. The apparatus of claim 16, wherein silicon carbonitride is on a surface of an area, exclusive of areas of the first contact and the second contact, of at least either one of the first bonding layer and the second bonding layer, and wherein the first contact and the second contact are electrically connected to each other.

* * * * *